United States Patent
Ito et al.

(10) Patent No.: US 6,288,531 B1
(45) Date of Patent: Sep. 11, 2001

(54) PROBE FOR ELECTRO-OPTIC SAMPLING OSCILLOSCOPE

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/495,087

(22) Filed: Jan. 31, 2000

(30) Foreign Application Priority Data

Feb. 3, 1999 (JP) .................................. 11-026716

(51) Int. Cl.⁷ .................................................. G01R 31/00
(52) U.S. Cl. ............................................. 324/96; 324/750
(58) Field of Search ............................. 324/96, 750, 753, 324/765; 439/482

(56) References Cited

U.S. PATENT DOCUMENTS 4,787,861 * 11/1988 Kruger et al. ........................ 439/482
4,920,310 * 4/1990 Aoshima et al. ....................... 324/96

FOREIGN PATENT DOCUMENTS 2 231 956 A    11/1980 (GB).
2 066 590 A    7/1981 (GB).

* cited by examiner

*Primary Examiner*—Safet Metjahic
*Assistant Examiner*—Etienne P LeRoux
(74) *Attorney, Agent, or Firm*—Darby & Darby

(57) ABSTRACT

An electro-optic probe is provided which is capable of maintaining the contact pressure of the metal pin on the test object at a constant and capable of protecting the safety of the electro-optic element during measurement. The electro-optic probe has a probe head which is attached to the probe body such that a relative position of the probe head in the direction of the optical path can be elastically regulated by a spring disposed between the probe head and the probe body.

7 Claims, 2 Drawing Sheets

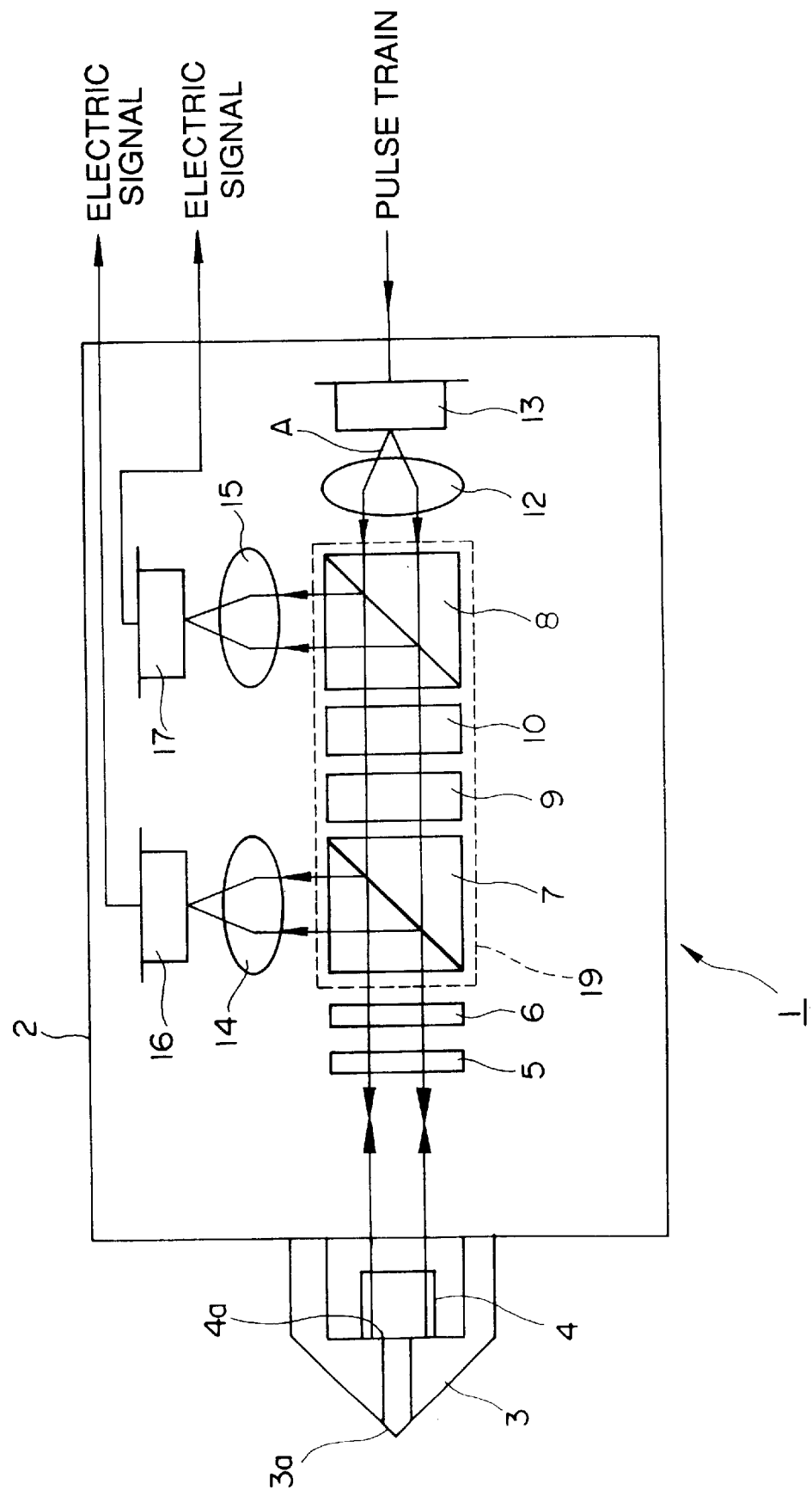

PROBE FOR ELECTRO-OPTIC SAMPLING OSCILLOSCOPE

BACKGROUND OF THE INVENTION

1. Field of the Invention

The present invention relates to an electro-optic probe, which is used for observing the waveforms of a test signal based on a change in the polarization state of a light pulse caused when the light pulse generated by a timing signal is input into an electro-optic crystal which is coupled with an electric field generated by the test measuring signal.

2. Background Art

An electro-optic probe is capable of observing waveforms of a test signal based on a change in the polarization state of a laser light caused when the light pulse generated by a timing signal is input into an electro-optic crystal which is coupled with an electric field generated by the test measuring signal. When the laser light is emitted in a pulsed mode, and when the test signal is used after sampling, the measurement can be executed that has a very high time resolution. An electro-optic sampling oscilloscope is developed by the use of the electro-optic probe.

The electro-optic sampling oscilloscope (hereinafter, called EOS oscilloscope) has following advantages over the conventional sampling oscilloscope using electric probes:

(1) Measurement is easy, because the ground line is not necessary during measurement.
(2) Since the metal pin disposed at the top of the electro-optic probe is insulated from the measuring circuit, a high input impedance is provided, which results in eliminating factors that disturb the conditions of the test point.
(3) The use of the light pulse allows carrying out wide band measurement reaching to the GHz order.

The structure of the conventional electro-optic probe used in the measurement of signals by the EOS oscilloscope will be described with reference to FIG. 2. In the electro-optic probe shown in FIG. 2, a probe head 3 made of an insulator is mounted at the top of the probe body 2 made of metal and a metal pin 3a is inserted in the probe head 3. The reference numeral 4 denotes an electro-optic element, and a reflecting film 4a is formed on the outside surface of the electro-optic element to which the metal pin 3a contacts. The reference numeral 5 denotes a half-wave plate and the numeral 6 denotes a quarter-wave plate. The numerals 7 and 8 denote polarizing beam splitters. The numeral 9 denotes a half-wave plate, 10 a Faraday element, 12 a collimating lens, 13 a laser diode, 14 and 15 condenser lenses, and 16 and 17 denote photodiodes.

These two polarizing beam splitters 7 and 8, the half-wave plate 9, and the faraday element 10 constitute an isolator used for passing the light emitted by the laser diode 13, and for separating the light reflected by the reflecting film 4a.

Next, the optical path of the laser light emitted from the laser diode 13 will be described with reference to FIG. 2. The path of the laser light is represented by the reference symbol A.

The laser beam emitted from the laser diode 13 is converted into a parallel beam by the collimating lens 12, and input into the electro-optic element 4, after rectilinearly advancing through the polarizing beam splitter 8, the Faraday element 10, the half-wave plate 9 and the polarizing beam splitter 7, and further passing the quarter-wave plate 6 and the half-wave plate 5. The light beam input into the electro-optic element 4 is reflected by the reflecting film 4a formed at the end surface of the electro-optic element 4 facing to the metal pin 3a.

The reflected laser beam enters the photodiode 16, after passing the quarter-wave plate 6 and a half-wave plate 5, being reflected by the polarizing beam splitter 7 and is condensed by the condenser lens 14. The laser beam, which passes the polarizing beam splitter 7, enters into the photodiode 17, after being reflected by the polarizing beam splitter 8 and condensed by the condenser lens 15.

The rotation angles of the half-wave plate 5 and the quarter-wave plate 6 are adjusted such that the intensities of two laser beams entering into two photodiodes becomes identical.

Hereinafter, the operation of measurement by the use of the electro-optic probe shown in FIG. 2 is described.

When the metal pin 3a is made to contact a measuring point, a voltage is generated at the metal pin 3a and the voltage propagates to the electro-optic element, which results in causing a change of the refractive index of the electro-optic element due to the Pockels effect. After the optical property of the electro-optic element changes, and when the laser beam emitted by the laser diode 13 enters and propagates through the electro-optic element, the polarization state of the electro-optic element changes. The laser beam having the thus changed polarization state is introduced into the photodiodes 16 and 17 and is converted into an electric signal after being reflected by the reflecting film 4a and being condensed by the condenser lenses 14 and 15, respectively.

The change of the voltage applied to the measuring point is reflected as the change of the polarization state of the laser light by the electro-optic element 4, and the change of the polarization state is detected by the difference between the output from the photodiodes 16 and 17. Thus, the electric signal applied to the metal pin 3a can be measured by the difference between the outputs of the photodiodes 16 and 17.

In the electro-optic probe 1 shown above, the electric signals obtained from these photodiodes are input into an oscilloscope for processing, but it is possible to measure signals by connecting a controller for controlling the signal measurement between these photodiodes 16 and 17 and a measuring device such as a real time-type oscilloscope. Thereby, wide band measurement is facilitated by the use of the electro-optic probe 1.

As described above, it is necessary for the metal pin 3a to contact with a test point in order to execute the measurement by the use of the electro-optic probe 1. Since a change of the contact pressure of the metal pin 3a with the electro-optic probe influences on the refractive index of the electro-optic probe, it has been necessary to maintain the contact pressure at constant, which has made this measurement difficult and time-consuming.

The contact of the metal pin 3a with the test point during measurement also raises a concern that damage may be caused to the metal pin and the electro-optic probe due to the shock applied to the metal pin 3a.

SUMMARY OF THE INVENTION

It is therefore the object of the present invention to provide an electro-optic probe which is capable of maintaining the contact pressure of the metal pin on the electro-optic element at constant, and which is capable of eliminating the damage to the metal pin and the electro-optic element.

According to the first aspect of the present invention, an electro-optic probe is provided which is composed of a probe body and a probe head mounted at the top end of the probe body, comprising: an optical path formed between the proximal end and the distal end of said probe body; a laser diode disposed at the proximal end of said probe body for emitting a laser beam; an elecro-optic element disposed in said probe head at the distal end of said light path and a reflecting film formed on one surface of said electro-optic element facing said metal pin for reflecting said laser beam; and a plurality of photodiodes for receiving the reflected laser beam after being split by respective polarizing beam splitters and for converting the received light to electric signals; and a metal pin mounted on said probe head such that the head of said test pin protrudes from said probe head; wherein, said probe head is attached to the distal end of said probe body in the manner such that the relative position of said probe head to the probe body can be regulated along the direction of the optical path, and such that the rotational displacement is restricted; and wherein, an elastic member is mounted between said probe head and said probe body so as to elastically restrict the relative displacement of said probe head to said probe body.

According to the second aspect of the present invention, in an electro-optic probe according to the first aspect, an engaging device consisting of a vis and a long vis hole is provided for engaging the probe head with the probe body, and the long vis hole is formed for receiving said vis and extends in the direction of the optical path in either one of said probe head and said probe body.

According to the third aspect, in an electro-optic probe according to the first aspect, said elastic member is a spring formed in the form of a coil so as to surround said optical path and the axis of the spring extends in the direction of said optical path.

According to the fourth aspect, in an electro-optic probe according to the first aspect, said photodiodes and said laser diode are connected to an electro-optic sampling oscilloscope and said laser diode emits a laser pulse as said laser beam based on a control signal generated by said electro-optic sampling oscilloscope.

According to the fifth aspect, in an electro-optic probe according to the first aspect, said laser diode emits a continuous laser light as said laser beam.

BRIEF DESCRIPTION OF THE DRAWINGS

FIG. 2 is a diagram showing a schematic view of a conventional electro-optic probe.

DETAILED DESCRIPTION OF THE INVENTION

Figure 1:
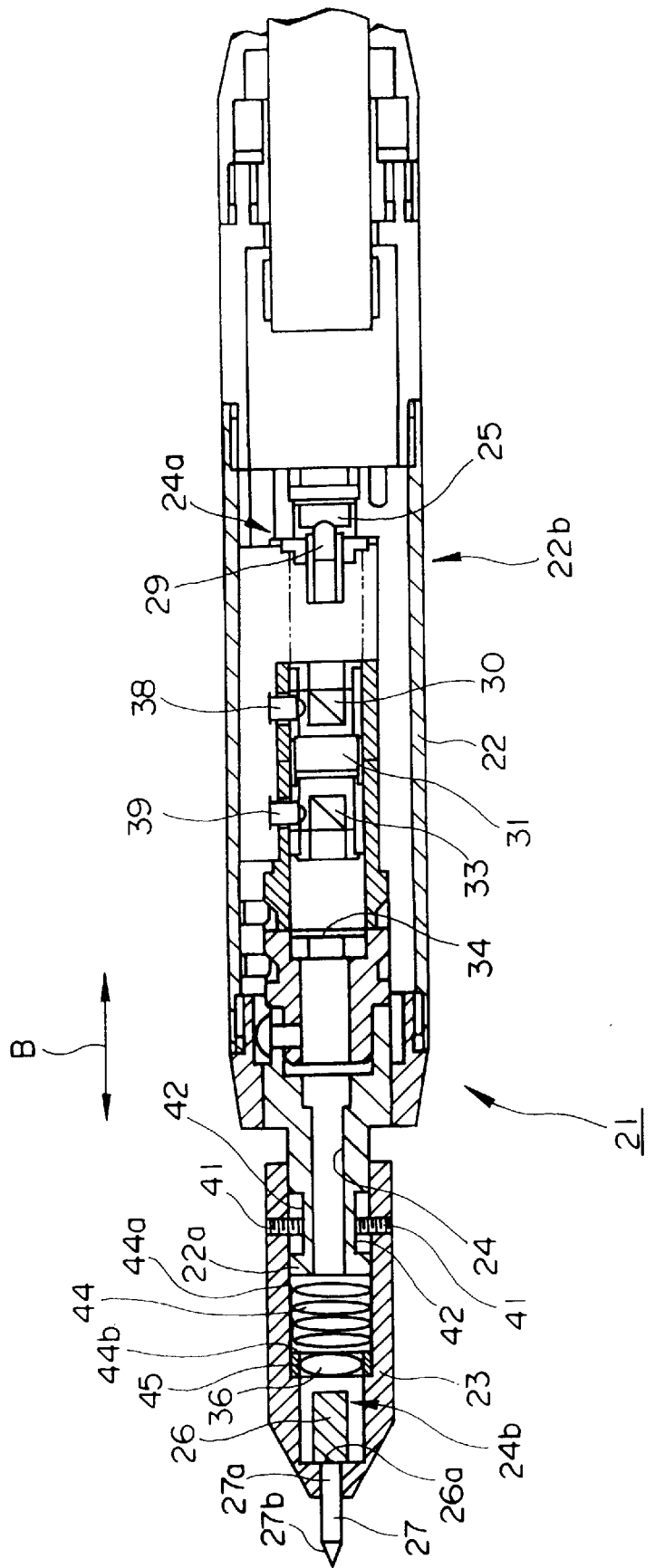
FIG. 1 is a longitudinal cross-sectional diagram showing an electro-optic probe of the present invention.

A preferred embodiment of the present invention will be described with reference to attached drawings.

FIG. 1 is a longitudinal cross-sectional diagram showing an electro-optic probe of the present invention. The electro-optic probe 21 comprises a probe body 22 and a probe head 23 mounted at the distal end 22a of the head body 22.

An optical path 24 is formed inside of the electro-optic probe 21. The optical path 24 is formed from the proximal end 22b to the distal end 22a, and the optical path 24 is connected to the inside of the probe head 23 from the distal end 22a.

At one end of the optical path 24 near the proximal end 22b of the electro-optic probe, a laser diode 25 is disposed connected to an EOS oscilloscope (not shown). The electro-optic probe 26 received in the probe head 23 is disposed at the other end of the optical path 24 at the distal end 22a side of the probe body 22.

Furthermore, a metal pin 27 is mounted at the distal end of the probe head 23. The metal pin is supported by the probe head 23. The proximal end 27a of the metal pin 27 is connected with the electro-optic element 26 and the distal end of the metal pin 27 protrudes from the probe head 23. A reflection film 26a is coated on the end surface of the distal end of the probe head 23.

On the optical path formed between the laser diode 25 and the electro-optic element 26, a collimating lens 29, a polarizing beam splitter 30, a Faraday element 31, a polarizing beam splitter 33, a quarter-wave plate 34, a condenser lens 36 are disposed in the direction from right to the left in FIG. 1. At the lateral side corresponding to the polarizing beam splitters 30 and 33, two photodiodes 38 and 39 are disposed. The EOS oscilloscope is connected to these photodiodes 38 and 39 such that the incident light can be transmitted to the EOS oscilloscope after converting into electric signals.

The polarizing beam splitters 30 and 33 function as isolators which isolate the light passing the optical path by reflecting it from the electro-optic element 26 to the photodiodes 38 and 39.

The probe head 23 is disposed such that its relative position can be displaced in the longitudinal direction shown by an arrow B. The probe head can be fixed to the probe body 22 by a vis 41 through a vis hole 42. However, the vis hole is formed as a long hole in the direction of B, and the probe head 23 can be disposed at a movable position in the B direction and restricted in the rotational direction.

A spring 44 is provided inside of the probe head 23. The spring 44 has an axis in the direction of B, and the spring 44 is formed in a coil form so as to surround the optical path 24. One end 44a of the spring 44 is fixed at the distal end 22a of the probe body 22 and the other end 44b of the spring 44 is attached to the end 22a of the probe head 22, so that the other end 44 is fixed at the lens supporting member 45 which supports the condenser lens 36. Since the spring 44 is disposed such that the axis of which coincides with the longitudinal direction (the direction B) of the optical path 24, the spring 44 plays the role of elastically regulating the relative positions of the probe head 23 to the probe body 22.

The action and the effect of the EOS oscillator are described hereinafter. When the electro-optic probe is used for measuring signals, the EOS oscilloscope is activated while the distal end 27a of the metal pin 27 is in contact with the test point. During the measurement, a laser beam, emitted from the laser diode 25 by the control signal generated by the EOS oscillator, reaches the electro-optic elements after being collimated by the collimating lens 29, advancing through the optical path 24, and being condensed by the condenser lens 36.

Since the condenser lens 36 is disposed at a position separated from the reflecting film 26a by the focal distance of the condenser lens 36, the laser beam condensed by the condenser lens 36 is condensed at a point on the reflecting film 26a. The condensed laser beam, after being reflected by the reflecting lens 26a and being collimated by the condenser lens 36 into a parallel beam, advances straight through the optical path 28 toward the laser diode 25.

At this stage, the refractive index of the electro-optic element 26 changes by the voltage change due to the change of the electric field at the test point propagated through the metal pin 27; thereby, the polarization state of the laser light propagating through the electo-optic element changes. The laser light having the changed polarization state, reflected from the electro-optic element 26, is isolated by the polarizing beam splitters 30 and 33, and enters into photodiodes 38 and 39, respectively, to be converted into electric signals. Thus, the change of the polarization state is detected by the difference between the outputs from these photodiodes 38 and 39.

In the above mentioned signal measurement, although it is necessary for the metal pin 27 to contact with the test point, the impact applied to the top end 27b of the metal pin 27 can be absorbed by the spring 44. Thus, even if an impact is mistakenly applied to the metal pin, the metal pin is not damaged, and it is possible to eliminate the damage of the electro-optic element caused by the impact applied on the metal pin 27.

The spring 44 has the function of relieving the impact and maintaining the force applied on the probe body 22 through the probe head 23 at a constant, so that the contact pressure of the metal pin 27 is maintained approximately at a constant, and the influence of the contact pressure on the refractive index of the electro-element can be prevented. Therefore, the present invention facilitates carrying out accurate signal measurement, and thus improvements in accuracy and efficiency of the measurement are obtained. The probe head 23 is fixed to the probe body 22 so as to restrict the displacement in the rotational direction, so that the rotational displacement of the probe head 23 causing the shift of the optical axis can be eliminated. Thus, the impact resistance and the safety of the EOS system can be secured.

A simple fastening structure by use of the vis 41 and the vis hole 42 is adopted in the present invention, which allows the relative position of the probe head 23 to be displaced along the B direction and restricts the displacement of the probe head in the rotational direction, and thus the electro-optic probe of the present invention can be produced at a reduced cost.

The spring 44 for maintaining the contact pressure of the metal pin 27 at constant is formed in the form of coil so as to surround the optical path 24. Thus, since the spring 44 size can be made so as to conform to the inside diameter of the probe head 23 and it is not necessary to adjust the coil diameter and to reduce the coil size, the electro-optic probe of the present invention can be produced without difficulty and at a reduced cost.

The present invention is not limited to the preferred embodiment described above, but the variants thereof can be envisaged without passing beyond the scope of the present invention.

For example, the spring 44 shown in the above embodiment, disposed between the probe head 23 and the probe body 22 for elastically restricting the relative position in the longitudinal direction along the optical path 24, may be replaced with a cylindrical rubber member. In addition, the elastic member may be disposed outside of the probe head 23, instead of being disposed inside of the probe head 23.

In the above described embodiment, when the continuous laser beam is emitted from the laser diode 25, conventional measuring devices such as the real-time oscilloscope, a sampling oscilloscope, and a spectrum analyzer can be used.

When these general devices are used, these general devices may be connected through the controller dedicated to the EO probe to the photodiodes 38 and 39, instead of the EOS oscilloscope.

What is claimed is:

1. An electro-optic probe comprising:
   a probe body and a probe head mounted at the distal end of the probe body and to be movable relative to the length of said probe body;
   a laser diode disposed at the proximal end of said probe body for emitting a laser beam;
   an electro-optic element disposed in said probe head having a reflecting film formed on one surface of said electro-optic element for reflecting said laser beam;
   optical means including polarization light splitters forming an optical path between said laser diode and said reflecting film on said electro-optic element;
   a metal pin mounted to said probe head having one end protruding from said probe head to contact a test point to receive voltage and its other end in contact with another surface of said electro-optic element, the polarization of said electro-optic element being changed in response to the voltage;
   a plurality of photodiodes for receiving the laser beam reflected from said reflecting film on said one surface of said electro-optical element after being split by respective polarization light splitters and for converting the received light to electric signals; and
   resilient mounting means for mounting said probe head to the distal end of said probe body to effect movement of said probe head relative to said probe body along the length of said probe body in response to pressure applied to said metal pin and to restrict rotational displacement of said probe head relative to said probe body.

2. An electro-optic probe according to claim 1, wherein said mounting means comprises a slot in one of said probe head and said probe body and a pin in the other of said probe head and probe body, said pin located in said slot.

3. An electro-optic probe according to claim 1, wherein said mounting means comprises a resilient coil spring, one end of said spring engaging said probe head at one end and the other end of said spring engaging said probe body.

4. An electro-optical probe as in claim 2 wherein said slot is linear.

5. An electro-optic probe as in claim 3 wherein the open center of said coil spring is in said optical path.

6. An electro-optic probe according to claim 1, wherein said photodiodes and said laser diode are connected to an electro-optic sampling oscilloscope and said laser diode emits a laser pulse as said laser beam based on a control signal generated by said electro-optic sampling oscilloscope.

7. An electro-optic probe according to claim 1, wherein said laser diode emits a continuous laser light as said laser beam.

* * * * *